(12) United States Patent
El-Ayat

(10) Patent No.: US 6,392,437 B2
(45) Date of Patent: May 21, 2002

(54) PROGRAMMABLE MULTI-STANDARD I/O ARCHITECTURE FOR FPGAS

(75) Inventor: Khaled Ahmad El-Ayat, Cupertino, CA (US)

(73) Assignee: Actel Corporation, Sunnyvale, CA (US)

(*) Notice: Subject to any disclaimer, the term of this patent is extended or adjusted under 35 U.S.C. 154(b) by 0 days.

(21) Appl. No.: 09/738,508

(22) Filed: Dec. 18, 2000

Related U.S. Application Data

(62) Division of application No. 09/224,929, filed on Dec. 31, 1998.

(51) Int. Cl.$^7$ .............................................. H03K 19/177
(52) U.S. Cl. .............................. 326/39; 326/38; 326/86
(58) Field of Search ............................... 326/37–41, 83, 326/86, 87; 327/525

(56) References Cited

U.S. PATENT DOCUMENTS

| 6,239,612 | B1 | * | 5/2001 | Shiflet | 326/39 |
| 6,271,679 | B1 | * | 8/2001 | McClintock et al. | 326/38 |
| 6,281,709 | B1 | * | 9/2001 | Seyyedy | 326/86 |

* cited by examiner

Primary Examiner—Michael Tokar
Assistant Examiner—Don Pau Le
(74) Attorney, Agent, or Firm—Sierra Patent Group, Ltd.

(57) ABSTRACT

The invention discloses an architecture for the input/output buffer section of an FPGA. It provides a convenient and efficient addressing scheme for addressing fuse matrices that are used to configure programmable input/output buffers in the FPGA. The programmable I/O buffers may be configured to implement a large number of different output and input bus standards

19 Claims, 6 Drawing Sheets

PROGRAMMABLE MULTI-STANDARD I/O ARCHITECTURE FOR FPGAS

This application is a division of Ser. No. 09/224,929, filed Dec. 31, 1998.

BACKGROUND OF THE INVENTION

1. Field of the Invention

The invention relates to Field Programmable gate Arrays. It relates to a configurable I/O architecture that allows user configuration of I/O modules of an FPGA.

2. Prior Art

Almost all integrated circuits (IC) use I/O buffers to connect internal circuit node to other circuits external to the IC. These I/O buffers can be Input, Output or bidirectional I/O. Further, each I/O buffer is designed to meet electrical specifications dictated by industry standards such as TTL, LVTTL, LVCMOS, GTL . It is also common for circuit designers to design each I/O buffer with multiple transistors in parallel. For example, 2–4 P-type transistors may be connected in parallel to form the pullup section of the buffer, while 2–4 N-type transistors may connected in parallel to form the pulldown section of the buffer. Designers may then decide to use some or all of the transistors as needed by the circuit application to meet performance criteria, a particular I/O standard and noise considerations.

Selection of the transistors connected into the circuit is usually done by masking options such as metal, Vias and contacts. Further, some FPGAs have used similar techniques to select one or more transistors into the I/O buffer to provide slew control. One such FPGA that performs this function is the ACT 1280 FPGA from Actel corporation. A user may configure his I/O buffer to have either fast slew or slow slew by programming an appropriate antifuse element. This feature allow the user control over speed and noise that is induced into the circuit by the switching I/O buffers.

Another FPCA that features configurable I/O buffers is the Virtex FPGA from Xilinx corporation as described in November 1998 product specification. It features highly configurable input and output buffer which provide support for a wide variety of I/O standards. Input buffers can be configured as either a simple buffer or as a differential amplifier input. Output buffers can be configured as either a Push-Pull output or as an Open Drain output. Selection of the desired standard is done by configuration memory bits. Further, different power supplies are provided to the I/O buffer as needed by the standard.

Several FPGA architectures have been described by ElGamal in U.S. Pat. No. 4,758,745 by El-Ayat in U.S. Pat. Nos. 5,451,887; 5,477,165 and 5,570,041 and by Plants in U.S. Pat. No. 5,625,301. The embodiments described in this invention will work very well with the above inventions.

BRIEF DESCRIPTION OF THE INVENTION

In this specification VCC will be defined as internal FPGA array voltage and supplies the voltage to the internal FPGA array. VCCI is defined as the input buffer supply and VCCO is defined as the output buffer supply providing the supply voltage needed by the input buffer and output buffer respectively. In early FPGAs all supply voltages were identical, for example 5V or 3.3V. However, with the scaling of gate oxides in advanced technologies such as 0.25 micron and beyond, it becomes necessary to reduce the internal array voltages further. I/O buffers may then need separate voltage supplies to meet a particular I/O standard.

In one aspect of the invention, a matrix of antifuses is used to configure the I/O buffers in an FPGA to meet certain application requirements. Each I/O buffer has a matrix of antifuses associated with it. The antifuses are addressed and programmed by programmable high voltage supply lines and addressing drivers located on the edge of each die. When programmed with a desired pattern, the antifuse matrices produce individual control signals, one for each antifuse, that are used to control and configure the I/O buffer. Configuration of the I/O buffer includes selection of the number and types of transistors used in the required application. For example, I/O buffer configuration may configure the I/O buffer as a push-pull driver in such standard applications as LVCMOS2, PCI, or AGP driver. It may also be used to configure the output buffer as an open drain buffer to meet application needs such as GTL and GTL+.

In another aspect of the invention the fuse matrix is used to configure the input buffer to meet the requirements of a certain standard. This includes selection of input trip point, and input style such as single input (PCI, LVCMOS2) or differential input such a GTL, GTL+ and AGP.

In another aspect of the invention the antifuse addressing and selection uses existing programmable voltage supply lines that are normally used to program FPGA array fuses. Only addressing drivers are added to program the antifuses. Eliminating the need for additional programmable supply lines results in significant savings in circuitry needed.

DESCRIPTION OF PREFERRED EMBODIMENT

Figure 1:
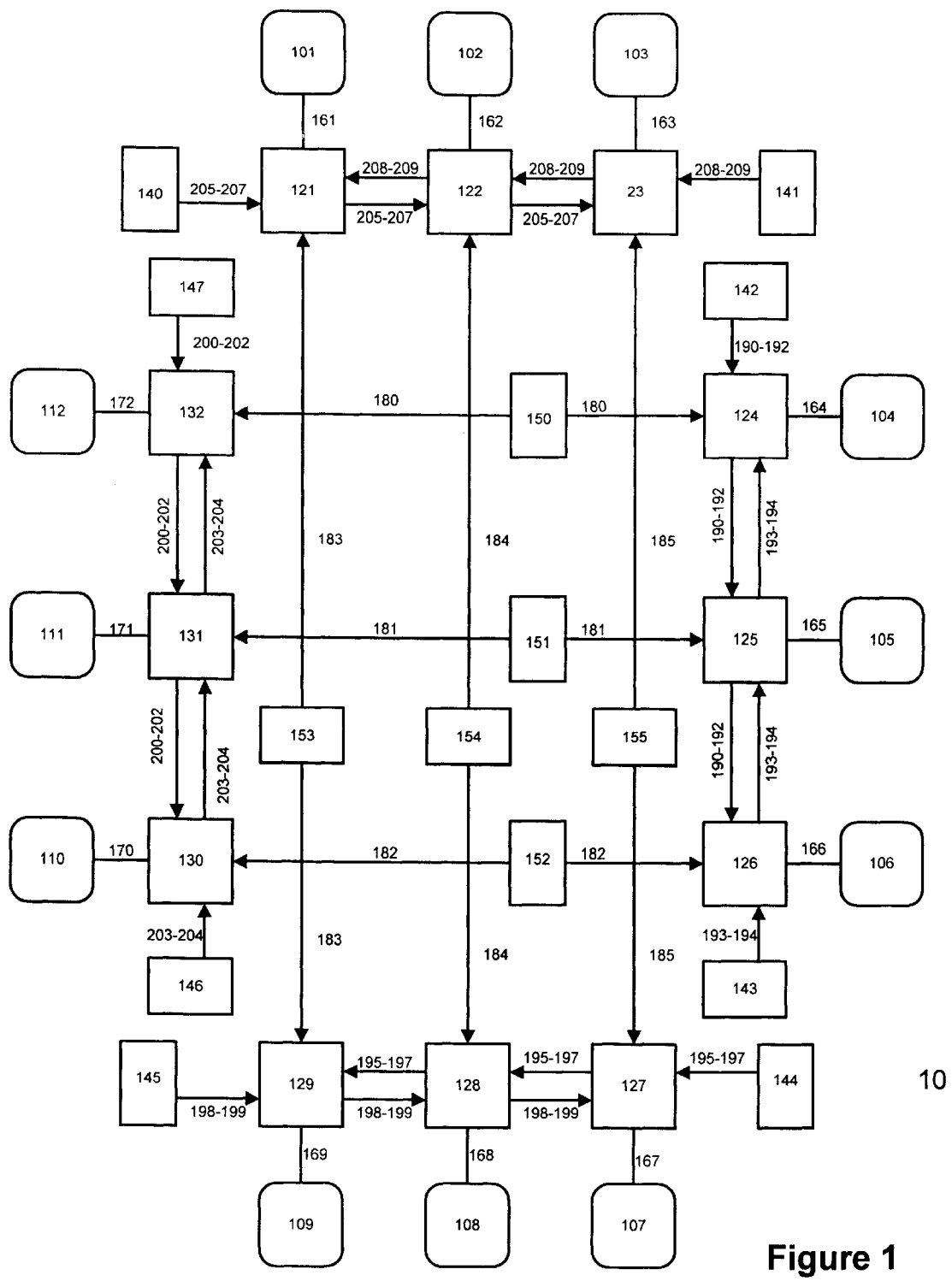
FIG. 1 shows a schematic of a portion of an FPGA with 12 programmable I/O buffers according to one aspect of the invention

FIG. 1 illustrates a sample FPGA (10) with 12 programmable I/O buffers according to one aspect of the invention. This sample FPGA 10 comprises 12 configurable I/O buffers 121–132. The I/O buffers are connected to external pads 101–112 by pad lines 161–172. The FPGA shown has only 12 such configurable buffers by way of illustration. Configurable I/O buffers 121–132 contain addressable fuse matrix blocks as well as the programmable I/O buffer itself and will be further described in FIGS. 2–4.

Configurable I/O buffers 121–132 receive fuse addressing information from fuse address drivers 140–147. They also receive programmable supply voltages from programmable supply voltage drivers 150–155. Fuse address driver 140 generates fuse address lines 205–207 which drive configurable I/O buffers 121–123. Fuse address driver 141 generates fuse address lines 208–209 which also drive configurable I/O buffers 121–123. Fuse address driver 142 generates fuse address lines 190–192 which drive configurable I/O buffers 124–126. Fuse address driver 143 generates fuse address lines 193–194 which also drive configurable I/O buffers 124–126. Fuse address driver 144 generates fuse address lines 195–197 which drive configurable I/O buffers 127–129. Fuse address driver 145 generates fuse address lines 198–199 which also drive configurable I/O buffers 127–129. Fuse address driver 147 generates fuse address lines 200–202 which drive configurable I/O buffers 130–132. Fuse address driver 146 generates fuse address lines 203–204 which also drive configurable I/O buffers 130–132. It should be clear to anyone skilled in the art that the number of drivers within a fuse address driver block may be increased to any desired number to increase the addressing space needed and thereby provide larger fuse matrices for configurable I/O buffers.

Programmable supply voltage driver 150 generates programmable supply voltage 180 and drives both configurable I/O buffers 124 and 132. Sharing programmable supply voltage drivers in this manner results in more efficient realization of the circuit by reducing in half the number of programmable supply voltage drivers. Programmable supply voltage driver 151 generates programmable supply voltage 181 and drives both configurable I/O buffers 125 and 131. Programmable supply voltage driver 152 generates programmable supply voltage 182 and drives both configurable I/O buffers 126 and 130. Programmable supply voltage driver 153 generates programmable supply voltage 183 and drives both configurable I/O buffers 121 and 129. Programmable supply voltage driver 154 generates programmable supply voltage 184 and drives both configurable I/O buffers 122 and 128. Programmable supply voltage driver 155 generates programmable supply voltage 185 and drives both configurable I/O buffers 123 and 127. It should be clear to anyone skilled in the art that additional programmable supply voltage drivers may be added to supply each configurable I/O buffer with additional supply lines as needed by the I/O buffer.

Configuration of the I/O buffers is now described by using buffer 124 by way of example. To configure I/O buffer 124, the required antifuse pattern must be programmed into the buffer. This fuse pattern is derived from bits of information stored in registers or latches within the programmable supply voltage driver 150 and the fuse address drivers 142 and 143. FPGAs normally have several modes of operation. Two such modes are Programming mode and Normal mode. The FPGA is first entered into the programming mode after which the required register pattern needed to address a particular antifuse cell within 124 is shifted into drivers 142, 143 and 150. For antifuse based FPGAs, a high voltage supply is needed to program the fuse. The high voltage supply is raised to the programming potential resulting in the programming of the selected antifuse. The process is repeated for all antifuses in the pattern needed to configure the I/O buffer. After programming is complete, the FPGA is switched to the Normal mode of operation. Antifuse programming will be further described in the detailed description of FIGS. 3a and 3b.

Figure 2:
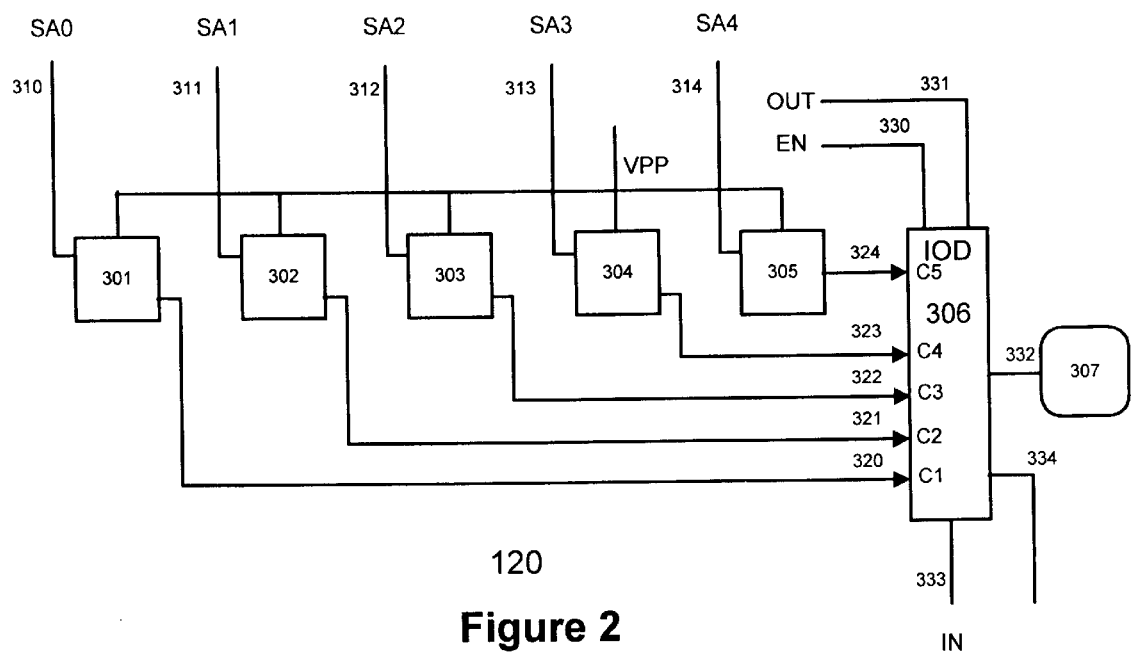
FIG. 2 is a schematic of a programmable I/O buffer with its associated antifuse matrix according to one aspect of the invention

FIG. 2 illustrates a schematic of a configurable I/O buffer 120 similar to configurable I/O buffers 121–132 shown in FIG. 1. Configurable I/O buffer 120 comprises an I/O driver circuit 306 as well as 5 antifuse matrix cells 301–305. Each antifuse matrix cell is driven by a programmable supply voltage line 315, a fuse address line and generates a configuration signal. Antifuse matrix cell 301 is driven by fuse address line 310 and generates configuration signal 320. Antifuse matrix cell 302 is driven by fuse address line 311 and generates configuration signal 321. Antifuse matrix cell 303 is driven by fuse address line 312 and generates configuration signal 322. Antifuse matrix cell 304 is driven by fuse address line 313 and generates configuration signal 323. Antifuse matrix cell 305 is driven by fuse address line 314 and generates configuration signal 324. All matrix cells share the same programmable supply voltage line 315. It should be clear to anyone skilled in the art that the number of antifuse matrix cells shown is illustrative and can be readily increased to supply the configurable I/O buffer with additional configuration signals to meet the requirements of the application. This aspect will be discussed further with the description of FIG. 5. I/O driver circuit 306 contains the configurable I/O buffer circuits. It receives configuration signals C1–C5 from antifuse matrix cells 301–305. It also receives enable control signal 330, output signal 331. It generates input signal 333. It is connected to I/O pad 307. Control signal 330 and output signal 331 are typically generated from the FPGA array and connected to the user's logic circuit. Input signal 333 is also connected to the FPGA array to be connected to the user's circuit. The functionality of the signals input, output and enable are well known in the field with respect to the operation of any I/O buffer.

In order to configure I/O buffer circuit 306 to a particular configuration, configuration signals 320–324 are configured to the required pattern of "1"s and "0"s. This is accomplished by programming the required pattern into antifuse matrix cells 301–305. To program a particular cell, its fuse address line and programmable voltage supply line are activated. For example, to program cell 303, programmable supply line 315 is activated by raising its voltage to approximately 12 Volts and fuse address line 312 is activated by raising its voltage to approximately 14 Volts. This will program cell 303 resulting in a configuration line 322 set to logic "1". Detailed operation of fuse matrix cells is described in conjunction with the description of FIGS. 3a and 3b below while detailed operation of I/O driver circuit 306 is described with FIG. 4 description below.

Figure 3A:
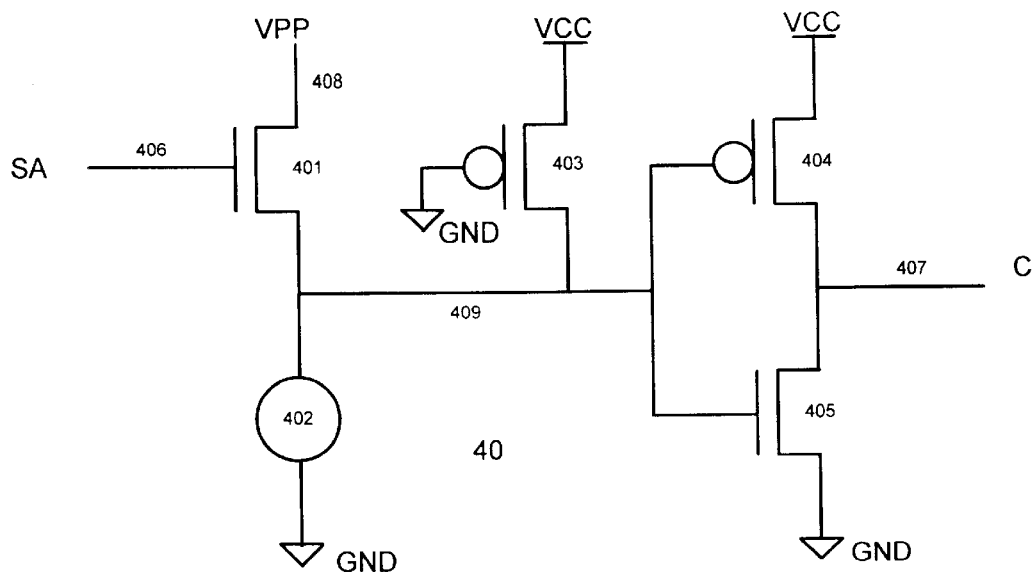
FIG. 3a shows a schematic of a first implementation of a single cell in the antifuse matrix

FIG. 3a shows the schematic of a first implementation of an antifuse matrix cell 40 similar to antifuse matrix cells 301–305 shown in FIG. 2. Matrix cell 40 has two inputs, fuse address line 406 and programmable supply voltage line 408. The output of the cell is configuration signal 407. 402 represents an antifuse symbol. Antifuses such as 402, exhibit very high resistance, greater than one mega ohm when open and a small resistance of 10–50 ohms when programmed. In order to program the antifuse, programmable voltage supply line 408 and fuse address line 406 are raised to a high programming voltage of approximately 12 Volts and 14 volts respectively, for an amorphous silicon type antifuse. This sequence turns ON transistor 401 which propagates the 12 volt supply line to node 409 causing antifuse 402 to rupture. This programmed antifuse will then behave as a 10–50 ohm resistor. It should be noted that fuse address line 406 and the programmable supply voltage 408 are active only during the programming of the antifuse. After programming, lines 406 and 408 are returned to zero volts. This is referred to as NORMAL mode of operation.

Circuit operation during NORMAL mode is as follows. Transistor 403 is designed as a weak transistor such that node 409 will remain close to zero volts if antifuse 402 is programmed. The final inverting stage of the circuit formed with transistors 404 and 405 inverts the value on node 409 and produces a configuration signal 407 equal to approximately VCC or logic HI. Alternatively, if antifuse 402 is not programmed, node 409 is pulled up to VCC by transistor 403, turning OFF transistor 404 and turning ON transistor 405. Output configuration signal 407 will go to zero. Thus, a configuration signal can be set to logic "1" or logic "0" as needed by simply programming or not programming the corresponding antifuse. Matrix cell 40 is shown for illustrative purposes. It is normally designed with small geometry transistors and occupies little area on the die. Other circuit variations are available and will work equally well.

Figure 3B:
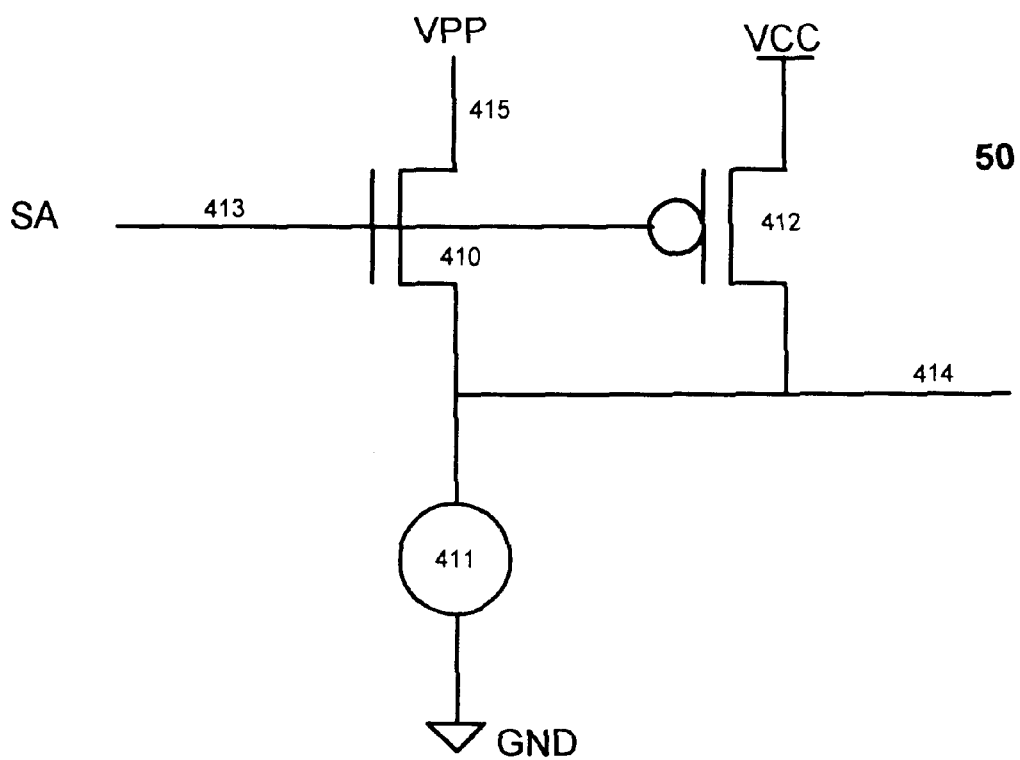
FIG. 3b shows a schematic of a second implementation of a single cell in the antifuse matrix

Another implementation of an antifuse matrix cell 50 is shown in FIG. 3b. Matrix cell 50 is similar to antifuse matrix cells 301–305 shown in FIG. 2. Matrix cell 50 has two inputs, fuse address line 413 and programmable supply voltage line 415. The output of the cell is configuration signal 414. 411 represents an antifuse symbol. The antifuse is programmed in the same way as fuse 402 in FIG. 3a above. Programmable voltage supply line 415 and fuse address line 413 are raised to a high programming voltage of approximately 12 Volts and 14 volts respectively, which causes fuse 411 to rupture and behave like a resistor. Antifuse matrix cell 50 however has no output inverter stage. Instead, in normal mode the fuse address line is "0" which turns ON P-channel transistor 412. If the fuse was programmed, it will pull node 414 to "0". If it is not programmed, node 414 is pulled to Vcc by transistor 414. This matrix cell is cheaper to build since it saves two transistors from each matrix cell. Note however that the polarity of configuration signal 414 is inverted compared with node 407 in cell 40. This works well because this eliminates the need for further inversions that are needed in to control the pulldown sections of the output buffer 306. Two matrix cells have been described with opposing polarity and can be used to advantage as needed in the programmable I/O buffer shown in FIG. 4.

Figure 4:
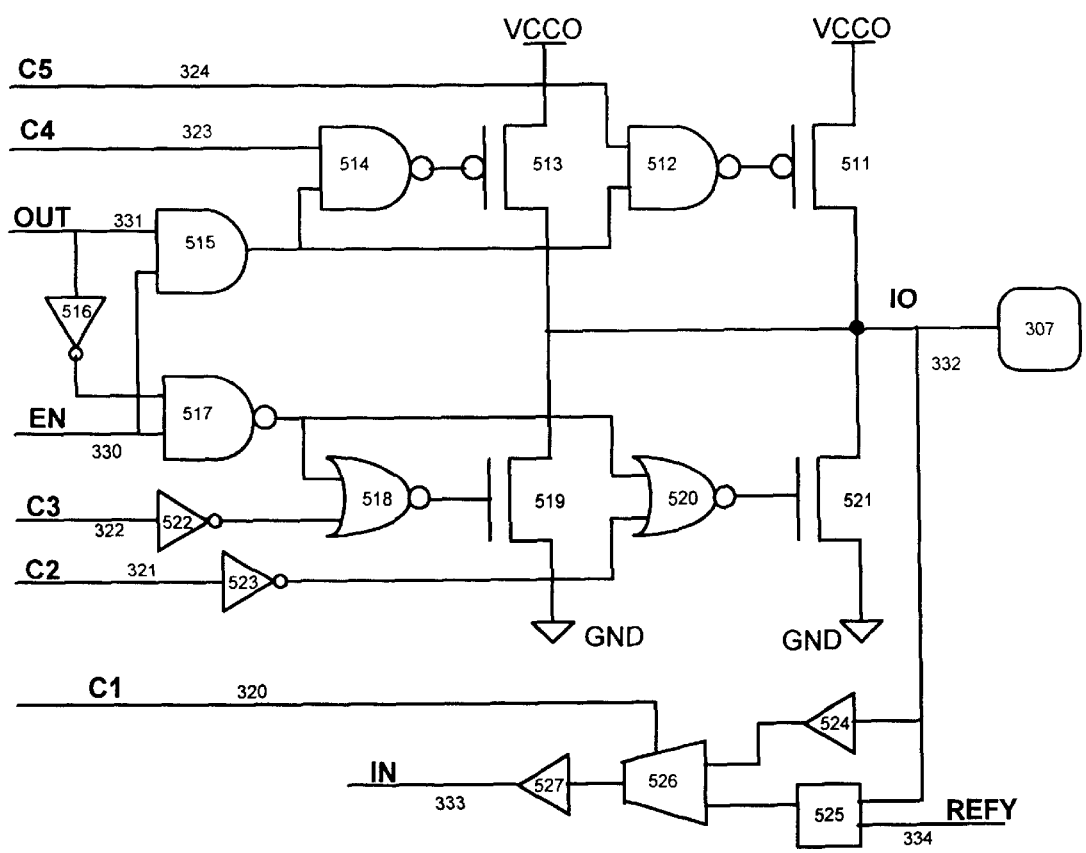
FIG. 4 shows a schematic of the programmable I/O buffer

A schematic of the programmable I/O driver circuit 306 is shown in FIG. 4. As discussed above, the circuit has input configuration signals 320–324, output and enable signals 331 and 330 and input signal 333. Output of the circuit 332 is connected to I/O pad 307. This sample output driver circuit has two P-channel pullup transistors 511 and 513 and two N-channel pulldown transistors 519 and 521. Pullup transistors 511 and 513 are drived by NAND gates 512 and 514, while pulldown transistors 519 and 521 are driven by NOR gates 518 and 520. Operation of the output section is controlled by configuration signals 321–324, output signal 331 and enable signal 330. In order to configure the driver circuit so that a particular pullup or pulldown transistor is configured into the circuit, its associated configuration signal must be active. For example, pullup transistor 511 is configured into,the circuit by programming configuration signal 324 to a logic "1" as described above. Similarly, pullup 513 is configured into the circuit by programming configuration 323 to a logic "1". These pullups are then enabled to react appropriately to the stimulus signals coming into the driver from the array, namely 331 and 330. If the enable signal 330 is "1" and the output signal 331 is also a "1", then both pullup transistors will drive output node 332 to "1". If the output signal 331 is "0", the pullups will be turned OFF and node 332 will not be driven to "1" as is common in any I/O driver circuit. If it is desired to deploy a weaker pullup circuit with only one pullup configured into the circuit, one of the configuration signals 323 or 324 will be set to "0". In this case only one of the pullups will participate in driving the output pad. Choice of which pullup to configure I determined by electrical requirements of the output application. Note that the source terminals of the pullups are connected to VCCO, the output supply voltage that is probably separate from the internal array voltage supply. For example, setting VCCO to 2.5 volts, would result in output voltages of 2.5 Volts. Different values of VCCO may be used to meet the requirements of a certain I/O standard such as 1.5, 2.5 or 3.3 volts.

The pulldown section of the output driver circuit operates in a similar way. To configure one or more pulldowns into the circuit their corresponding configuration signals are programmed. Configuration signal 321 enables pulldown 521 and allows it to participate in driving the output pad. Similarly, configuration signal 322 allows pulldown 519 to participate in driving the output pad. Logic gates 515–517 constitute a standard predriver circuit used to translate input signals 330, 331 into the required levels necessary to drive the output pullups and pulldowns of the I/O driver as is well known in the art.

The input section of the I/O driver comprises input buffer 524, differential input buffer 525, 2:1 multiplexer 526 and buffer 527. Configuration of the input section is controlled by configuration signal 320. Input to the circuit is provided by I/O pad 307 which is connected to line 332 and drives both buffers 524 and 525. Buffer 524 is a single input buffer such as TTL, LVTTL, LVCMOS as is well known in the art. Buffer 525 is a differential input buffer used in certain I/O industry standards that require differential input comparison such as GTL, GTL+, HSTL and AGP. Buffer 525 requires a differential reference voltage input 334 which would be set to a value as dictated by the I/O standard. For example, GTL standard requires a reference input voltage of 0.8 volts. The two buffers 524 and 525 feed 2:1 multiplexer 526 whose output is buffered by buffer 527 before being fed into the FPGA array circuit on line 333. Selection between the two buffer types, 524 and 525, is determined by configuration signal 320. Thus, by appropriately programming matrix cell 301 in FIG. 2, configuration signal 320 is set to the desired value to configure the input section as a single or differential input driver. When differential input mode is required, the appropriate reference voltage value is connected to terminal 334. It should be clear to anyone skilled in the art that the input section can be easily expanded to accommodate more input buffer types by simply adding new buffer types and expanding the multiplexer and its control inputs.

The above discussion has detailed the design and operation of a programmable I/O driver 306. The circuit provides 4 programmable options in the output driver section and one programmable option in the input section. It is clear that the number and types of programmable options can be readily expanded to suit the requirement of the designer.

Figure 5A:
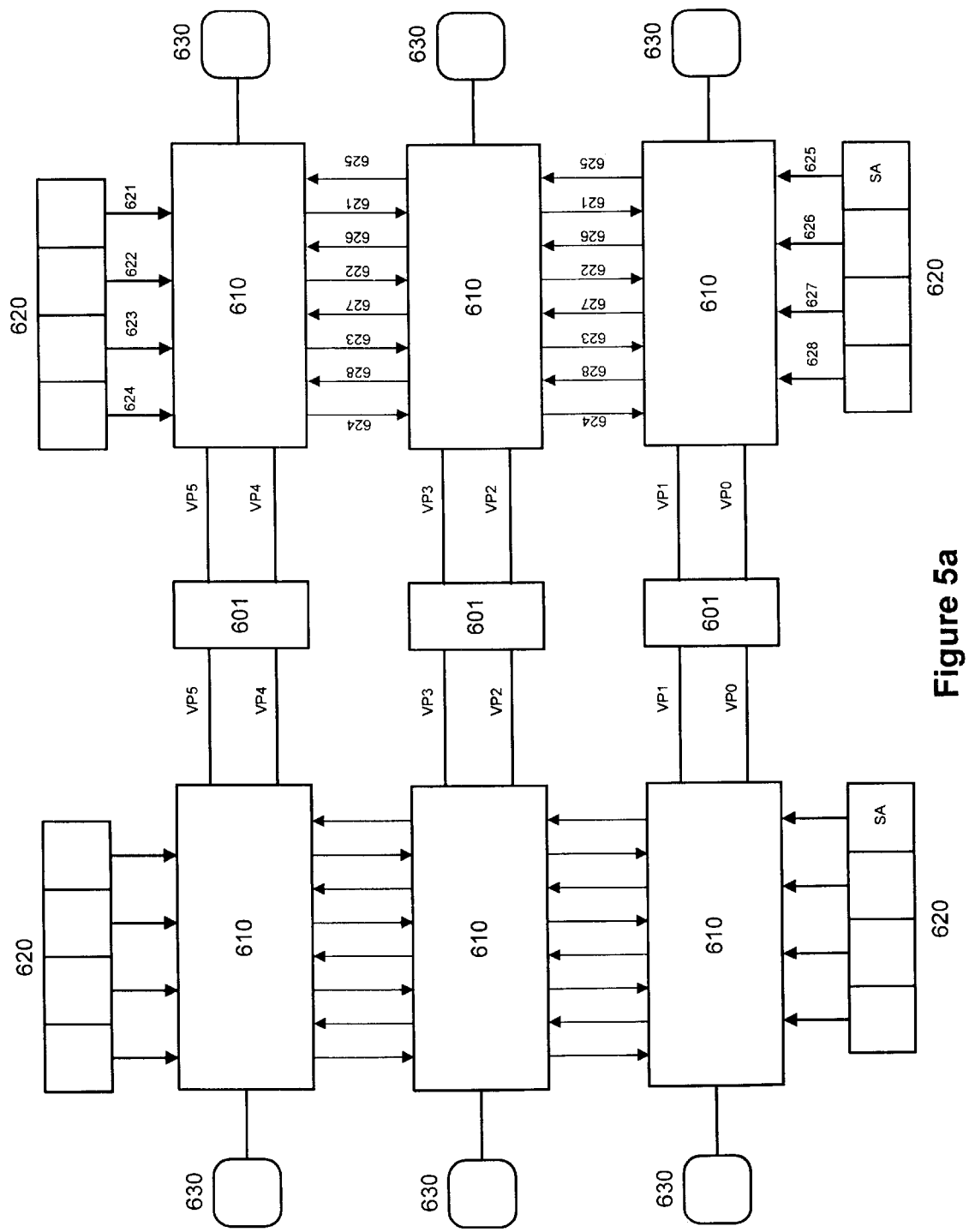
FIG. 5a is a schematic of a another type of programmable I/O buffer architecture that provides for 16 programmable options per I/O buffer
Figure 5B:
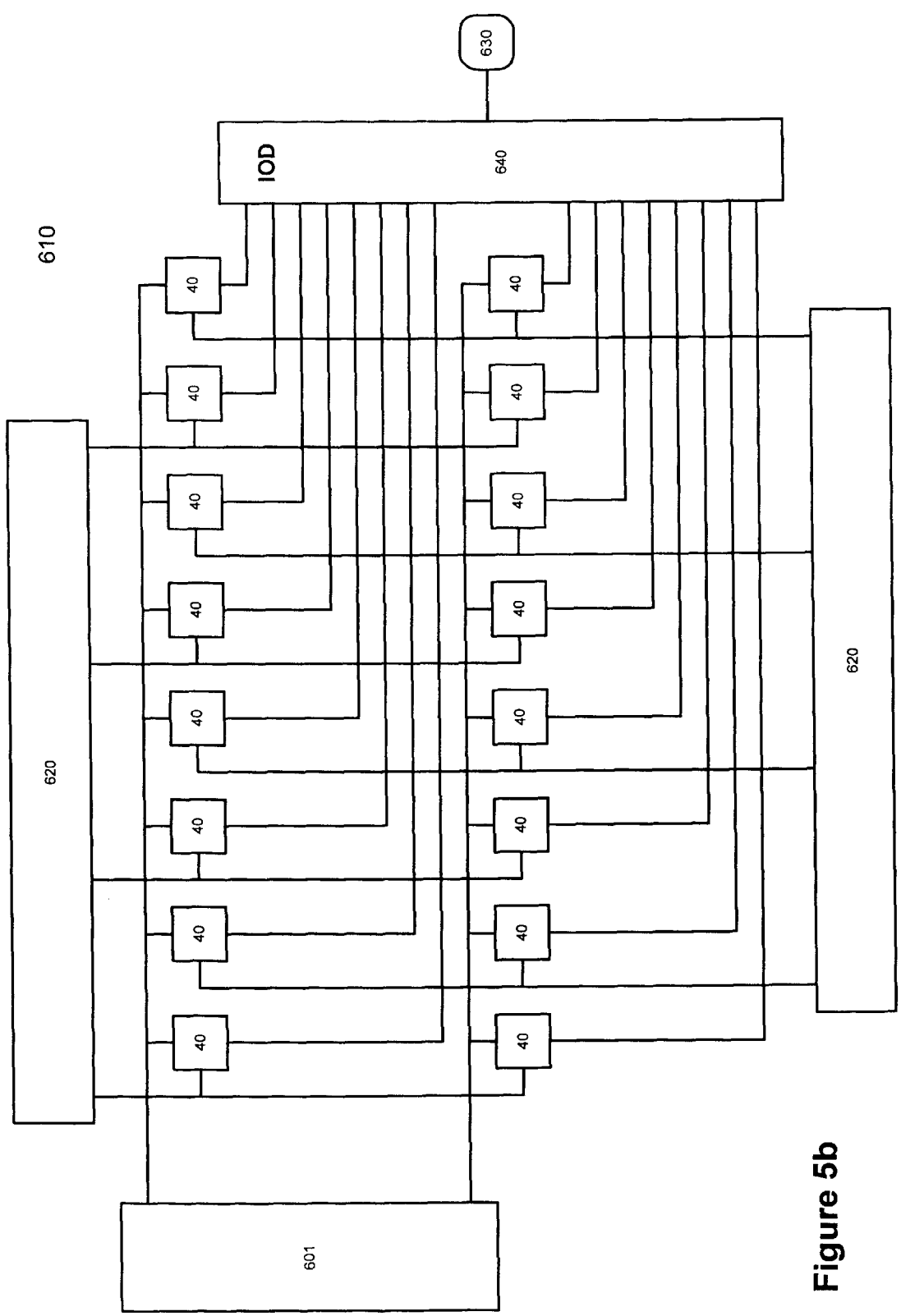
FIG. 5b is a schematic of the programmable I/O buffer of FIG. 5a with its associated antifuse matrix according to another aspect of the invention

Another embodiment of the programmable I/O buffer architecture are shown in FIGS. 5a and 5b. FIG. 5a illustrates the architecture needed to configure 6 programmable I/O buffers 610 with their associated fuse address drivers 620 and programmable supply voltage drivers 601. Programmable I/O buffer 610 has 16 configuration options requiring a fuse matrix of 16 cells per I/O buffer. Each fuse address driver block 620 generates 4 addresses, while each programmable supply voltage driver block 601 generates two independent supply voltages. A simple calculation shows that 16 addresses are generated within each I/O buffer circuit 610 using 8 fuse address drivers (2×620 blocks) and 2 supply voltages from programmable supply voltage diver 601. FIG. 5a has 6 programmable I/O buffers to illustrate the possible sharing of common circuits to configure the I/O buffers. For example, fuse address drivers 620 would reside on one side of the die and generate all necessary fuse address information for that side of the die. Using this arrangement, 2 drivers similar to 620 can service the needs of 40–100 I/O buffers. Programmable voltage supply drivers 601 are usually available inside the FPGA array and used to program fuses internal to the FPGA array. No additional programmable supply lines are needed.

FIG. 5b further illustrates the organization of programmable I/O buffer 610 with 16 configurable options. A discussed earlier in FIGS. 2 and 3, a fuse matrix cell 40 is located at the intersection of each fuse address line and programmable voltage supply line. The resulting matrix contains 16 such cells 40 uniquely addressable by activating the appropriate voltage supply line and the fuse address line. The matrix cells generate 16 configuration signals which then feed and configure the I/O driver circuit 640. I/O driver circuit 640 is similar to driver 306 shown in FIG. 4 but with additional configuration options. As discussed above, additional options include additional P-channel pullup transistors, additional N-channel Pulldown transistors and additional input buffer types.

While the preferred embodiment pertains to the use of antifuses as the main configuration device, other types of programmable devices may be used such as EEPROM cells and memory latches.

Thus, preferred embodiments of the invention have been illustrated and described with reference to the accompanying drawings. Those of skill in the art will understand that these preferred embodiments are given by way of example only. Various changes may be made without departing from the scope and spirit of the invention, which is intended to be defined by these claims:

What is claimed is:

1. In a field programmable gate array, a user programmable input/output architecture including:
   programmable antifuse address drivers,
   programmable voltage supply drivers,
   programmable input/output buffers,
   means to program said input/output buffers to implement a plurality of input/output standards where said means includes
   a plurality of two-terminal, normally open, electrically programmable antifuses characterized by a high impedance before programming, selectively programmable by the user to create a permanent low impedance electrical connection.

2. The input/output architecture of claim 1 where said programming means further includes said antifuse address drivers.

3. The input/output architecture of claim 1 where said programming means further includes said voltage supply drivers.

4. The input/output architecture of claim 1 where said input/output buffers are connected to external pads.

5. In a field programmable gate array, a user programmable input/output architecture including:
   programmable antifuse address drivers,
   programmable voltage supply drivers,
   programmable input/output buffers,
   means to program said input/output buffers to implement a plurality of input/output standards where said means include a plurality of antifuse matrix cells each cell including,
   an input node,
   an output node,
   a first N-channel transistor having its gate connected to said first input node, its source connected to a first voltage and its drain connected to said output node,
   a two terminal electrically programmable antifuse selectively programmable by the user having one terminal connected to ground and the second terminal connected to said output node,
   a second P-channel transistor having its gate connected to said input node, its source connected to a second voltage and its drain connected to said output node,
   at least one two-terminal, normally open, electrically programmable element characterized by a high impedance before programming, selectively programmable by the user to create a permanent low impedance electrical connection.

6. The input/output architecture of claim 5 where said antifuse matrix cell input nodes are driven by said antifuse address drivers.

7. The input/output architecture of claim 5 where said programmable input/output buffers are driven by said output nodes of said antifuse matrix cells.

8. The input/output architecture of claim 5 where said programmable input/output buffers are configured by said output nodes of said antifuse matrix cells.

9. The input/output architecture of claim 5 where said programmable input/output buffers are configured to implement a plurality of input/output standards by said output nodes of said antifuse matrix cells.

10. The input/output architecture of claim 5 where each of said programmable input/output buffer is configured to implement a plurality of input/output standards by 16 of said antifuse matrix cells.

11. The input/output architecture of claim 5 where each of said programmable input/output buffer is configured to implement 16 separate input/output standards by 16 of said antifuse matrix cells.

12. In a field programmable gate array, a user programmable input/output architecture including:
   programmable antifuse address drivers,
   programmable voltage supply drivers,
   programmable input/output buffers,
   means to program said input/output buffers to implement a plurality of input/output standards where said means include a plurality of antifuse matrix cells, each cell having an input node and an output node.

13. The input/output architecture of claim 12 where said antifuse matrix cells are connected to said antifuse address drivers and said voltage supply drivers.

14. The input/output architecture of claim 12 where each of said antifuse matrix cells includes
   at least one two-terminal, normally open, electrically programmable antifuse element characterized by a high impedance before programming, selectively programmable by the user so as to determine the voltage level of said output node of said antifuse matrix cell.

15. The input/output architecture of claim 12 where said programmable input/output buffers are configured by said output nodes of said antifuse matrix cells.

16. The input/output architecture of claim 12 where said programmable input/output buffers are connected to said output nodes of said antifuse matrix cells.

17. The input/output architecture of claim 12 where said input/output standards include the LVCMOS2 standard.

18. The input/output architecture of claim 12 where said input/output standards include the GTL standard.

19. The input/output architecture of claim 12 where said input/output standards include the PCI standard.

* * * * *